Figure 1:
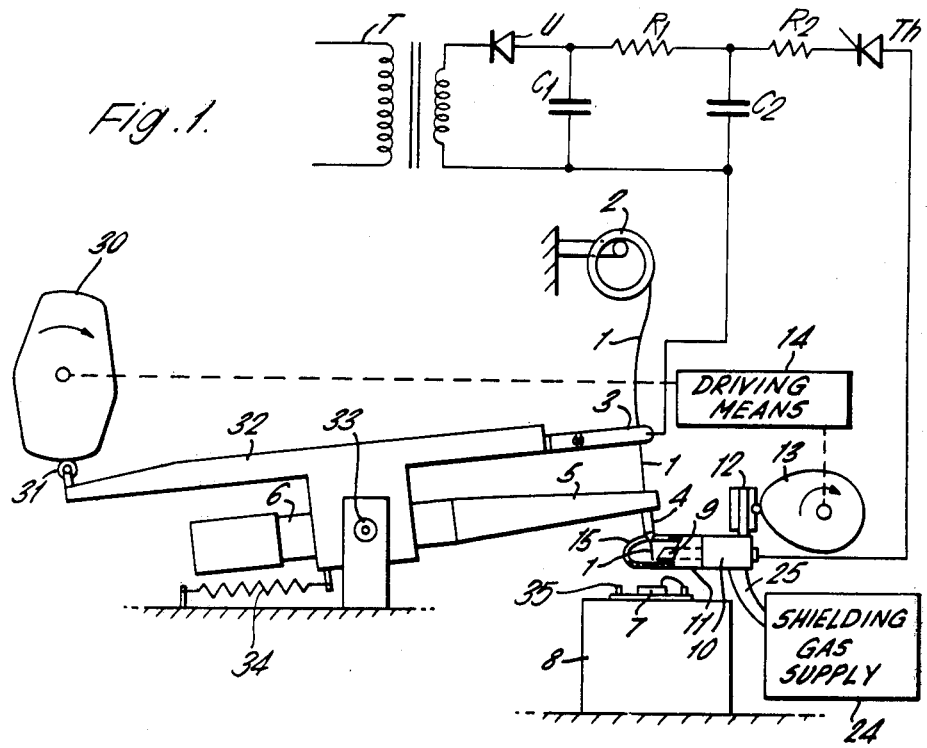

United States Patent [19]

Edson et al.

[11] 4,323,759
[45] Apr. 6, 1982

[54] ELECTRICAL INTER-CONNECTION METHOD

[75] Inventors: Donald A. Edson; Keith I. Johnson; Michael H. Scott, all of Cambridge, England

[73] Assignee: The Welding Institute, Abington, England

[21] Appl. No.: 123,492

[22] Filed: Feb. 21, 1980

Related U.S. Application Data

[62] Division of Ser. No. 925,458, Jul. 17, 1978, abandoned.

[30] Foreign Application Priority Data

Jul. 26, 1977 [GB] United Kingdom ............... 31346/77

[51] Int. Cl.³ ...................... B23K 11/22; B23K 31/00
[52] U.S. Cl. ........................... 219/137 PS; 219/56.22; 228/123; 228/173 E
[58] Field of Search ............. 219/137 PS, 130.4, 113, 219/137 R, 56, 56.1, 56.22; 228/110, 123, 141.1, 164, 173 E

[56] References Cited

U.S. PATENT DOCUMENTS 2,679,570 5/1954 Cisne ..................................... 219/56
2,759,088 8/1956 Lincoln ........................ 219/137 PS

OTHER PUBLICATIONS

D. Baker et al., "An Improved Form of Thermocompression Bond", *British Journal of Applied Physics*, vol. 16, 1965, pp. 865–868.

*Primary Examiner*—C. C. Shaw
*Attorney, Agent, or Firm*—Kemon & Estabrook

[57] ABSTRACT

To permit ball-bonding of wires of aluminium or aluminium alloy to small electrical circuits or components, a spark discharge is created between the end of the wire and an electrode in a shielding atmosphere with a peak current density in the wire section which is from 40 to 450 times that used for ball-bonding gold wire. In this way oxidation of the ball is prevented.

1 Claim, 2 Drawing Figures

ELECTRICAL INTER-CONNECTION METHOD

This is a division, of application Ser. No. 925,458, filed July 17, 1978, now abandoned.

This invention is concerned with the electrical inter-connection of small components or circuits and is expected to find a particular application to the connection of integrated silicon circuit chips to substrate circuits.

Integrated silicon circuit chips are currently connected to substrate circuits by aluminium wires of, for example, 25 μm diameter, or by gold wires. In one technique, a wedge-shaped ultrasonic tool is used to connect the aluminium or gold wires to the pads on the silicon chip or to the pads on the substrate circuit.

In another known technique, a ball is formed on the end of a gold wire and the gold ball is then connected to the silicon chip or substrate circuit by thermocompression or ultrasonic bonding. The ball may be formed by applying a hydrogen flame to the wire, or by creating a spark discharge between the wire and an electrode. The spark discharge is formed by applying a sufficient voltage (350 volts or over) between the gold wire and another electrode to cause a discharge to take place in the space between them.

Ball bonding has a number of advantages over bonding using wedge tools. Furthermore a mono-metallic aluminium joint between the aluminium pads and the wires would be desirable because it would eliminate the possibility of brittle inter-metallic compounds, leading to increased reliability as well as because of ecomomic considerations. Nevertheless, for many years it was considered impracticable to apply the ball bonding technique to aluminium. When the wire was subjected to a flame, the oxide layer which forms very rapidly on an exposed surface of aluminium prevented the formation of a satisfactory ball. With the spark discharge equipment used for ball bonding of gold wire, a ball could be formed on aluminium wire but again the ball was heavily oxidised and was unusable. When an attempt was made to form a ball on aluminium wire in a protective atmosphere (for example argon), a glow discharge resulted without the formation of a ball.

In the British Journal of Applied Physics, 1965, Vol.16, Pages 865 to 868, it was reported by D. Baker and I. E. Bryan in an article entitled "An improved form of thermocompression bond" that an unsuccessful attempt had been made to develop a method of ball bonding aluminium wires; among the heat sources tried were a focused laser beam, a microplasma torch, capacitor discharge and a miniature radiant heater. They found however that the surface oxide film was sufficient to oppose the surface tension forces tending to form the required spherical end, even when heating was carried out in a protective atmosphere.

We discovered that it was possible to form a ball with wires of aluminium or aluminium alloy by applying between the wire and electrode a voltage not greater than 200 volts, which is considerably less than that used for gold wire (650 volts), and by bringing the wire and the electrode into temporary contact to fuse the wire end and form the spark discharge, while supplying shielding gas to the region of the spark discharge.

This method, which is the subject of our U.S. Pat. No. 4,098,447 dated July 4, 1978 works well but has one disadvantage, which is that because of the contact method of spark initiation the wear on the electrode is increased, so that electrodes need more frequent replacement than they would if the discharge were initiated across a gap.

We have now found that it is possible to form balls on a wire of aluminium or aluminium alloy in a shielding atmosphere with a spark discharge initiated across a gap. According to the present invention, in a method of forming a ball on a wire of aluminium or aluminium alloy by spark discharge to permit ball bonding of the wire to a component or terminal the spark discharge is formed by applying across the gap between an electrode and the wire, and in a shielding atmosphere, a voltage between 350v and 10,000v, the circuit resistance being such that the peak current density in the wire section is from $1.2 \times 10^9 A/m^2$ to $13.5 \times 10^9 A/m^2$.

At the lower end of the current density range, this value is about 40 times that used for ball-bonding of gold and at the higher end of the range it is about 450 times the value for gold. It is emphasised that the current density value used for ball-bonding of gold will form balls on aluminium wire in air but these are defective because of oxidation. In argon, a glow discharge results, without the formation of a ball, unless the current density is increased by a factor of at least 40, as disclosed above.

The current for the discharge is provided from a capacitance which, for a 25 μm wire, may have a value of between 0.2 and 0.5 microfarads. For a power source with an output of 500 volts, the circuit resistance should be between 75 and 850 ohms, giving a peak current with a value of 6.7 amps at the lower end of the resistance range and 0.6 amps at the higher end of the resistance range.

Using values within these ranges, we find that balls of good quality can be formed in argon with aluminium wire 25 μm diameter, the wire being positive in the circuit.

Figure 2:
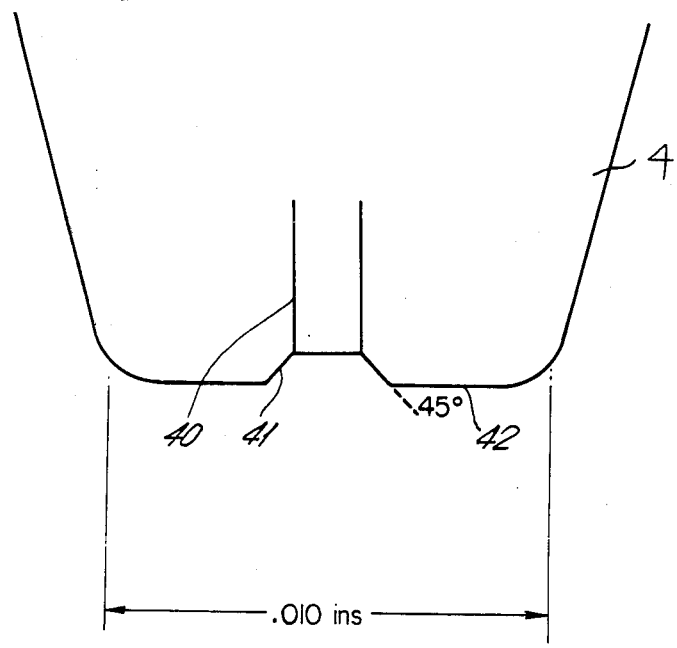

In order that the invention may be better understood, an example of apparatus for carrying out the invention will now be described with reference to the accompanying drawings, in which:

FIG. 1 shows a circuit for forming the ball on the tip of a wire of aluminium or aluminium alloy; and FIG. 2 illustrates the preferred bonding tool for use with the aluminium wire on which the ball has been formed.

In FIG. 1, a wire 1 extends from a reel 2 through a conductive clamp 3 and a capillary nozzle 4 formed on the end of the horn 5 of an ultrasonic welding tool 6. The wire tip extending from the capillary nozzle 4 is to be welded to a micro-circuit 7 located on a receiving base 8.

To form a ball on the end of the wire, a spark discharge is created between the tip of the wire 1 and an electrode 9 across a gap of about 0.005ins (0.125mm). The electrode 9 is supported in a holder 10 formed with a transparent forward portion 11 (shown in section in the drawing) and is mounted on the end of a pivoted arm 12. A cam 13 rotated by means of a driving means 14 pivots the arm 12 to advance the electrode to the position shown in FIG. 1 for ball formation, and then permits the arm 12 to retract to permit bonding. The transparent forward portion of the electrode holder 10 is formed with a slot 15 to permit the nozzle tip and wire to pass into the electrode holder as it is advanced.

A first capacitor C1 is charged through a transformer T and rectifier U and is connected through a resistor R1 across storage capacitance C2 which provides the discharge current. The capacitor C2 discharges through a resistor R2 when a thyristor Th is triggered and the arc discharge is then initiated between the electrode 9 and the wire end. A shielding gas supply 24 is connected through a tube 25 to the interior of the electrode holder. During the arc discharge, a shielding gas flows along the electrode and wire tip and out through the slot 15.

The values of capacitance C2 and resistor R2 are within the ranges given above.

The spark discharge between the wire and electrode results in the formation of a ball on the end of the wire.

As the cam 13 continues to rotate, the electrode is withdrawn.

The driving means 14 also drives a cam 30. The cam 30 acts through a follower 31 to pivot an arm 32, on the end of which the conductive clamp 3 is mounted, about an axis 33. The ultra-sonic transducer assembly 6 also pivots about the axis 33. In the position shown in FIG. 1, the cam 30 has pivoted the arm 32 and transducer assembly 6 to raise the conductive clamp 3 and the capillary nozzle 4 above the work piece to permit formation of the ball. When the ball has been formed, the cam 30 is rotated to allow the conductive clamp 3 and capillary nozzle 4 to pivot downwards to bring the ball into contact with the microcircuit. A spring 34 maintains the follower 31 in contact with the cam 30. The ultra-sonic transducer 6 is then energised and acts through the ultra-sonic horn 5 to vibrate the nozzle 4 and therewith the ball on the end of the wire against the micro-circuit, to form an ultra-sonic bond in a known manner.

When the wire has been joined to the micro-circuit in the manner described above, it can be connected to a lead-out terminal 35. The manner of connecting the wire to the terminal 35 forms no part of the present invention; in practice, wedge bonding can be used because the bonding area available is larger. For the connection to the micro-circuit, the bonding area available is small and the amount of energy required to make the bond is more critical. If desired, the capillary nozzle 4 can be used to make the wedge bond to the lead-out terminal in known manner.

In this example, we have illustrated ultra-sonic bonding of the wire to the micro-circuit and this is the form of bonding which we prefer. However, it is also possible to connect the ball formed on the end of the wire of aluminium, or aluminium alloy, to the micro-circuit by thermo-compression bonding.

FIG. 2 illustrates in cross-section the working end of the preferred bonding tool. A capillary hole 40 passes axially through the tool and terminates at the working face in a flared opening 41. The angle made by the wall of the flared opening with the axis of the tool is 45°. The working face comprises a substantially plane annulus 42 having an outer diameter of approximately 0.010 inches (254 µm). The flared opening provides a recess into which the ball is pulled in known manner, prior to bonding, to improve the mechanical alignment of the aluminium wire and ball with the component or terminal following the bond.

The electrode is preferably tungsten. The tool may be of titanium carbide or of tungsten carbide usually with some cobalt.

Although reference has been made to bonding with aluminium wire of 25 µm diameter, and component values have been given for wire of this diameter, the method of the invention can also be used with wires of other diameters. For example, with an aluminium wire of 75 µm diameter, we have used a capacitance of 3.1 µF and a resistance of 30 ohms, with a 500 volt power source. Generally speaking, the capacitance value increases in proportion to the cross-sectional area of the wire. The invention can also be employed with aluminium wire of 375 µm.

We claim:

1. A method of forming a ball on a wire of aluminium or aluminium alloy by spark discharge to permit ball bonding of the wire to a component or terminal, comprising the step of forming the spark discharge by applying a voltage between 350v and 10,000v across a gap between an electrode and the wire in a shielding atmosphere, the circuit resistance being such that the peak current density in the wire section is from $1.2 \times 10^9 A/m^2$ to $13.5 \times 10^9 A/m^2$.

* * * * *